United States Patent
Chiu et al.

(10) Patent No.: US 8,053,178 B2
(45) Date of Patent: Nov. 8, 2011

(54) MASK-LESS METHOD AND STRUCTURE FOR PATTERNING PHOTOSENSITIVE MATERIAL USING OPTICAL FIBERS

(75) Inventors: Tzu Yin Chiu, Shanghai (CN); Jesse Huang, Shanghai (CN); Simon Tarng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 848 days.

(21) Appl. No.: 11/765,399

(22) Filed: Jun. 19, 2007

(65) Prior Publication Data
US 2008/0252868 A1    Oct. 16, 2008

(30) Foreign Application Priority Data
Apr. 12, 2007    (CN) .......................... 2007 1 0039506

(51) Int. Cl.
*G03B 27/32*    (2006.01)
(52) U.S. Cl. ............... 430/322; 430/5; 430/311; 355/77
(58) Field of Classification Search ......................... None
See application file for complete search history.

(56) References Cited

U.S. PATENT DOCUMENTS

| 2003/0091277 | A1  | 5/2003 | Mei |
| 2004/0008811 | A1* | 1/2004 | Yamamoto ...................... 378/34 |
| 2004/0165847 | A1* | 8/2004 | Kim et al. ..................... 385/116 |
| 2006/0134535 | A1  | 6/2006 | Porque |

* cited by examiner

*Primary Examiner* — Daborah Chacko Davis
(74) *Attorney, Agent, or Firm* — Kilpatrick Townsend and Stockton LLP

(57) ABSTRACT

A method for patterning objects, e.g., semiconductor wafer, glass plate, composite, etc. The method includes providing an object, which has an overlying layer of photosensitive material. The method includes selectively applying light through one or more fiber cores from a plurality of fiber cores. Each of the fiber cores has an input end and an output end. Each of the input ends is coupled to the optical source. The plurality of fiber cores is numbered from 1 through N, where N is an integer greater than 1. Each of the output ends is also numbered from 1 through N, which corresponds respectively to each of the plurality of fiber cores numbered from 1 through N. The method exposes the photosensitive material from light emitted selectively through the one or more fiber cores. The one or more fiber cores out(s) light respectively through one or more output ends of the fiber cores. Each of the output ends numbered from 1 through N is associated with a pixel numbered respectively from 1 through N.

14 Claims, 5 Drawing Sheets

MASK-LESS METHOD AND STRUCTURE FOR PATTERNING PHOTOSENSITIVE MATERIAL USING OPTICAL FIBERS

CROSS-REFERENCES TO RELATED APPLICATIONS

This application claims priority to Chinese Application No. 200710039506.3, filed on Apr. 12, 2007, commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to procure mask sets used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, mask sets used for the manufacture of the custom integrated circuits are often expensive. That is, they can cost hundreds of thousands of U.S. dollars and take along lead-time to make. Additionally, there are a limited amount of mask shops that manufacture masks, also leading to difficulty in procuring the mask sets for the custom integrated circuits. These and other limitations are described throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning.

In a specific embodiment, the invention provides a method for patterning objects, e.g., semiconductor wafer, glass plate, composite materials, etc. The method includes providing an object, which has an overlying layer of photosensitive material. The method includes selectively applying light through one or more fiber cores from a plurality of fiber cores. Each of the fiber cores has an input end and an output end. Each of the input ends is coupled to the optical source. The plurality of fiber cores is numbered from 1 through N, where N is an integer greater than 1. Each of the output ends is also numbered from 1 through N, which corresponds respectively to each of the plurality of fiber cores numbered from 1 through N. The method exposes the photosensitive material from light emitted selectively through the one or more fiber cores. The one or more fiber cores out(s) light respectively through one or more output ends of the fiber cores. Each of the output ends numbered from 1 through N is associated with a pixel numbered respectively from 1 through N.

In an alternative specific embodiment, the invention provides an apparatus for patterning objects for the manufacture of integrated circuits. The apparatus includes an optical source. A plurality of fiber cores is coupled to the optical source. Each of the fiber cores has an input end and an output end. Each of the input ends is coupled to the optical source. The plurality of fiber cores is numbered from 1 through N, where N is an integer greater than 1. Each of the output ends is numbered from 1 through N, which corresponds respectively to each of the plurality of fiber cores numbered from 1 through N. An array is coupled to each of the plurality of fiber cores. The array is configured to allow each of the fiber ends to output toward a common plane. An object is operably coupled to the common plane. The object includes a photosensitive material, which has a surface that faces (directly or indirectly) the common plane. A pattern is exposed onto the photosensitive material. The pattern composed of a plurality of beams numbered from 1 through N output from respective fiber ends numbered from 1 through N.

In an alternative specific embodiment, the invention provides a method for patterning objects, e.g., semiconductor wafer, glass plate, composite materials, etc. The method includes providing an object, which has an overlying layer of photosensitive material. The method includes selectively applying light through one or more fiber cores from a plurality of fiber cores. Each of the fiber cores has an input end and an output end. Each of the input ends is coupled to the optical source. The plurality of fiber cores is numbered from 1 through N, where N is an integer greater than 1. Each of the output ends is also numbered from 1 through N, which corresponds respectively to each of the plurality of fiber cores numbered from 1 through N. The method exposes the photosensitive material from light emitted selectively through the one or more fiber cores. The one or more fiber cores out(s) light respectively through one or more output ends of the fiber cores. Each of the output ends numbered from 1 through N is associated with a pixel numbered respectively from 1 through N. Each of the pixels is at a first state or a second state or an nth state, depending upon the embodiment. A combination of the pixels at different states forms a spatial pattern on the photosensitive material.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods and resulting structures for the manufacture of semiconductor devices are provided. More particularly, the invention provides a method and device for manufacturing a photolithography mask for the manufacture of integrated circuits. Merely by way of example, the invention has been applied to one or more masks for the manufacture of integrated circuits. But it would be recognized that the invention has a much broader range of applicability. For example, the invention can be applied to photosensitive material on the wafer itself, or other substrate object that requires exposure to light for patterning.

Figure 1:
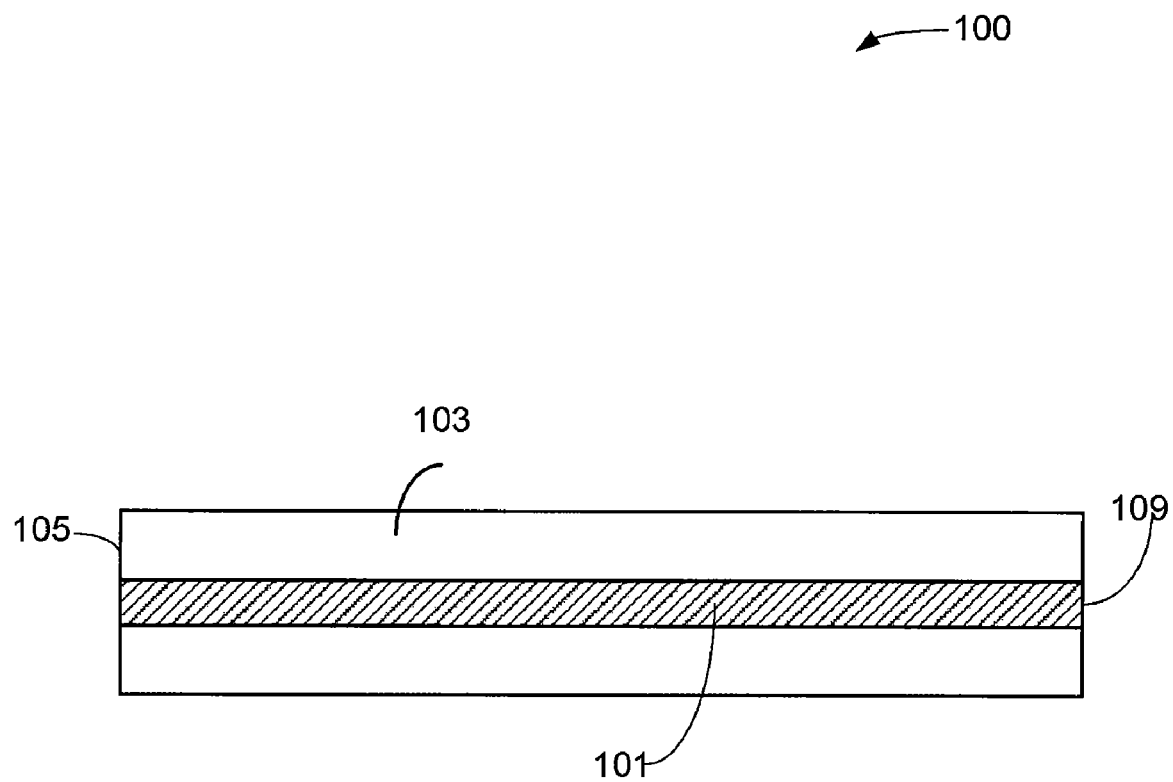
FIG. 1 is a simplified side-view diagram of a fiber optic cable according to an embodiment of the present invention.

FIG. 1 is a simplified side-view diagram of a fiber optic cable 100 according to an embodiment of the present invention. This diagram is merely an example, which should not unduly limit the scope of the claims herein. One of ordinary skill in the art would recognize many variations, alternatives, and modifications. As shown, the fiber optic cable includes cladding layer 103 overlying core region 101. The cable also includes a first end 105 and a second end 109. The first end receives a light beam from a source, which can be modulated. The second end emits light. Preferably, the light is modulated in a first state, which corresponds to an on state, or a second state, which corresponds to an off state. Alternative nth states, including various levels of gray scales are also included, depending upon the embodiment. The second end can have a dimension ranging from about 0.2 microns and more, depending upon the embodiment. Each of fiber corresponds to a pixel element for a larger pattern, which will be described in more detail throughout the present specification and more particularly below.

Figure 2:
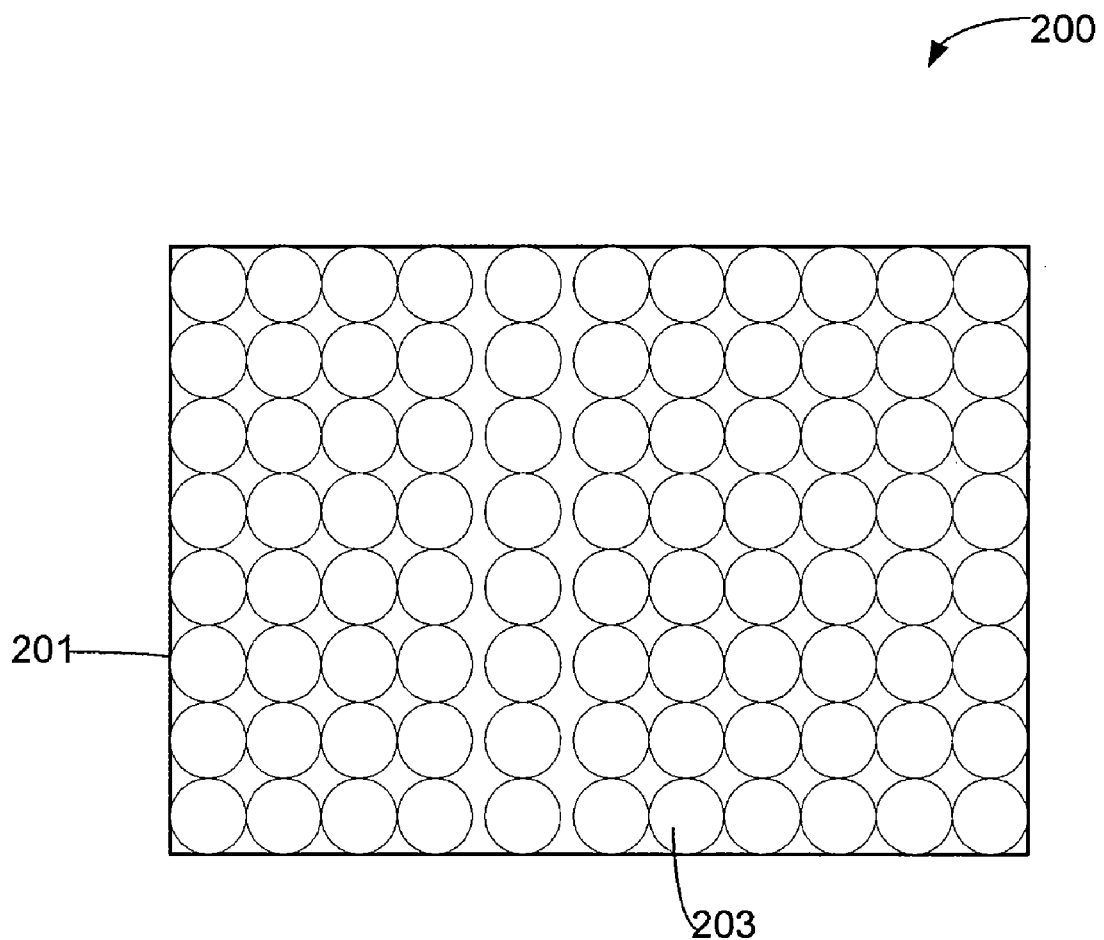
FIG. 2 is a simplified top-view diagram of a fiber optic array according to an embodiment of the present invention.

FIG. 2 is a simplified top-view diagram 200 of a fiber optic array according to an embodiment of the present invention. This diagram is merely an example, which should not unduly limit the scope of the claims herein. One of ordinary skill in the art would recognize many variations, alternatives, and modifications. As shown, the array 201 bundles each of the tips of the fiber optic cables. Each of the tips 203 corresponds to a pixel element. A combination of such pixel elements corresponds to a larger pattern according to a specific embodiment. The present array is implemented in the apparatus described below, but can also be implemented in other apparatus.

Figure 3:
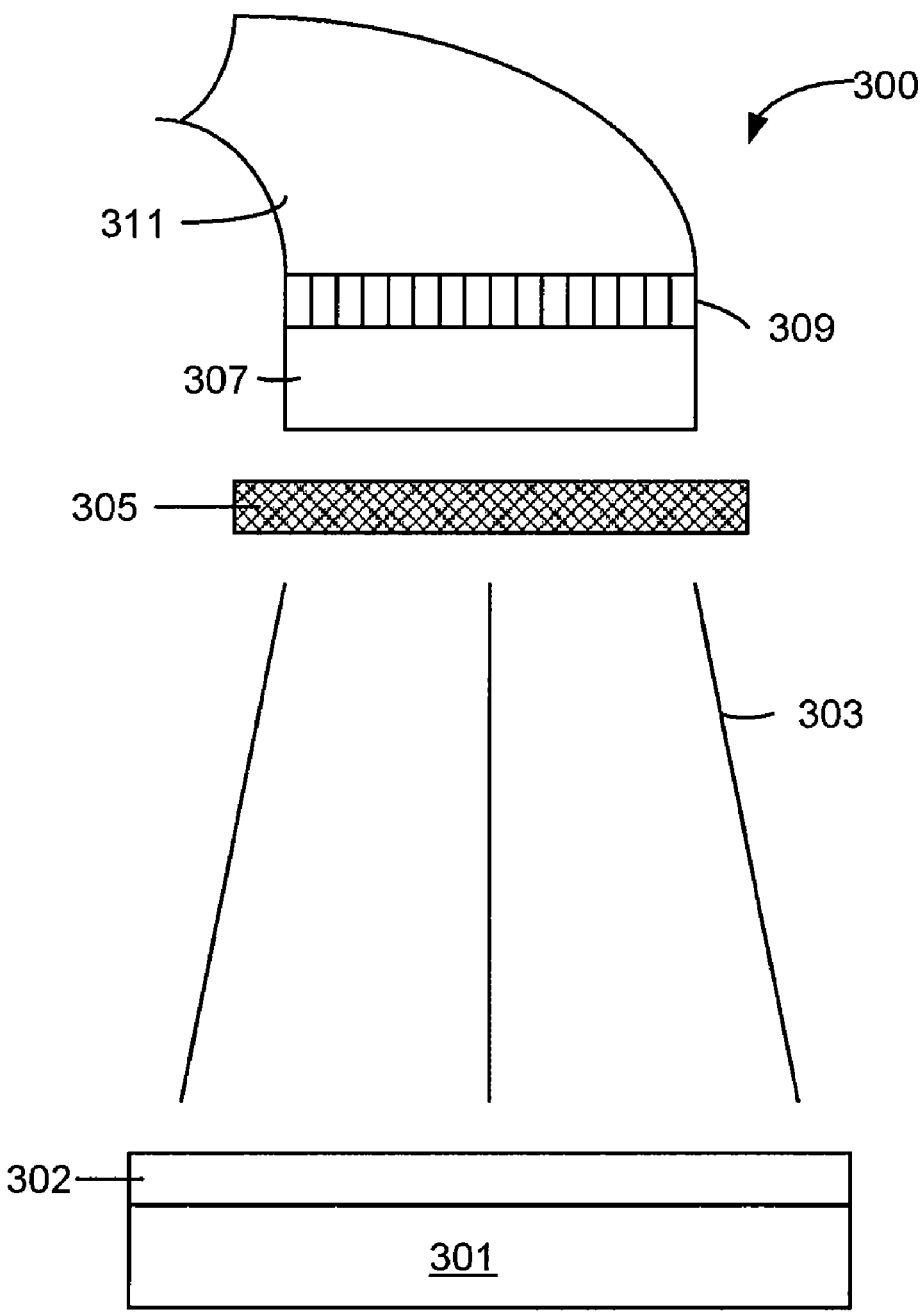
FIG. 3 is a simplified side-view diagram of an optical apparatus according to an embodiment of the present invention.

FIG. 3 is a simplified side-view diagram 300 of an optical apparatus according to an embodiment of the present invention. This diagram is merely an example, which should not unduly limit the scope of the claims herein. One of ordinary skill in the art would recognize many variations, alternatives, and modifications. As shown, the apparatus includes an optical source, which selectively provides light through a plurality of fiber cores in a fiber bundle 311. As noted, each of the fiber cores has an input end and an output end. Each of the input ends is coupled to the optical source. The plurality of fiber cores is numbered from 1 through N, where N is an integer greater than 1. Each of the output ends is numbered from 1 through N, which corresponds respectively to each of the plurality of fiber cores numbered from 1 through N. As merely an example, the fiber is a suitable type.

An array 309 is coupled to each of the plurality of fiber cores. The array is configured to allow each of the fiber ends to output toward a common plane 307. The array is arranged in a geometric configuration, which can form a raster image. The geometric configuration is composed of a plurality of pixel elements. Such pixel elements correspond to the outputs of each of the fiber cores. Depending upon the embodiment, the array can be made of any suitable material for holding each of the fiber ends in place relative to each other and also relative to the common plane. Of course, the array configuration depends upon the application.

An object 301 is operably coupled to the common plane. The object includes a photosensitive material 302, which has a surface that faces (directly or indirectly) the common plane. The photosensitive material can include photoresist such as positive or negative resist. A pattern is exposed onto the photosensitive material 302. The pattern composed of a plurality of beams 303 numbered from 1 through N output from respective fiber ends numbered from 1 through N. The pattern is made from selectively allowing light to illuminate through one or more of the outputs numbered from 1 through N. Depending upon the embodiment, the object can include a blank mask, a semiconductor substrate, glass, composite, etc.

The apparatus also includes an optical lens 305 coupled between the fiber array and the object. The lens can be a single lens or multiple lens. The lens can also be applied individually to each of the fiber ends. Alternatively, the lens can be 4:1, 5:1 or 10:1 correction Depending upon the embodiment, there can be many other variations, modifications, and alternatives.

A method according to an embodiment of the present invention can be briefly provided as follows:

1. Provide an object, e.g., semiconductor wafer, glass plate, having an overlying layer of photosensitive material;
2. Select a file from memory associated with a pattern to be printed onto the object;
3. Process the file;
4. Determine output based upon the file;
5. Selectively apply light through one or more fiber cores from a plurality of fiber cores based upon the output from the file, where the plurality of fiber cores is numbered from 1 through N, where N is an integer greater than 1;
6. Output light selectively through one or more output ends associated respectively with the one or more fiber cores;
7. Directing the output light through a common plane;
8. Traverse the output light through a lens;
9. Expose the photosensitive material from light emitted selectively through the one or more fiber cores;
10. Form a pattern on the photosensitive material from the exposed portions of the photosensitive material;
11. Develop and pattern the photosensitive material;
12. Process the object including the patterned photosensitive material; and
13. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. Preferably, the steps provide a method of using fiber optic cables configured in an array to selectively apply light onto photosensitive materials for exposure. Further details of the present method can be found throughout the present specification and more particularly below.

Figure 4:
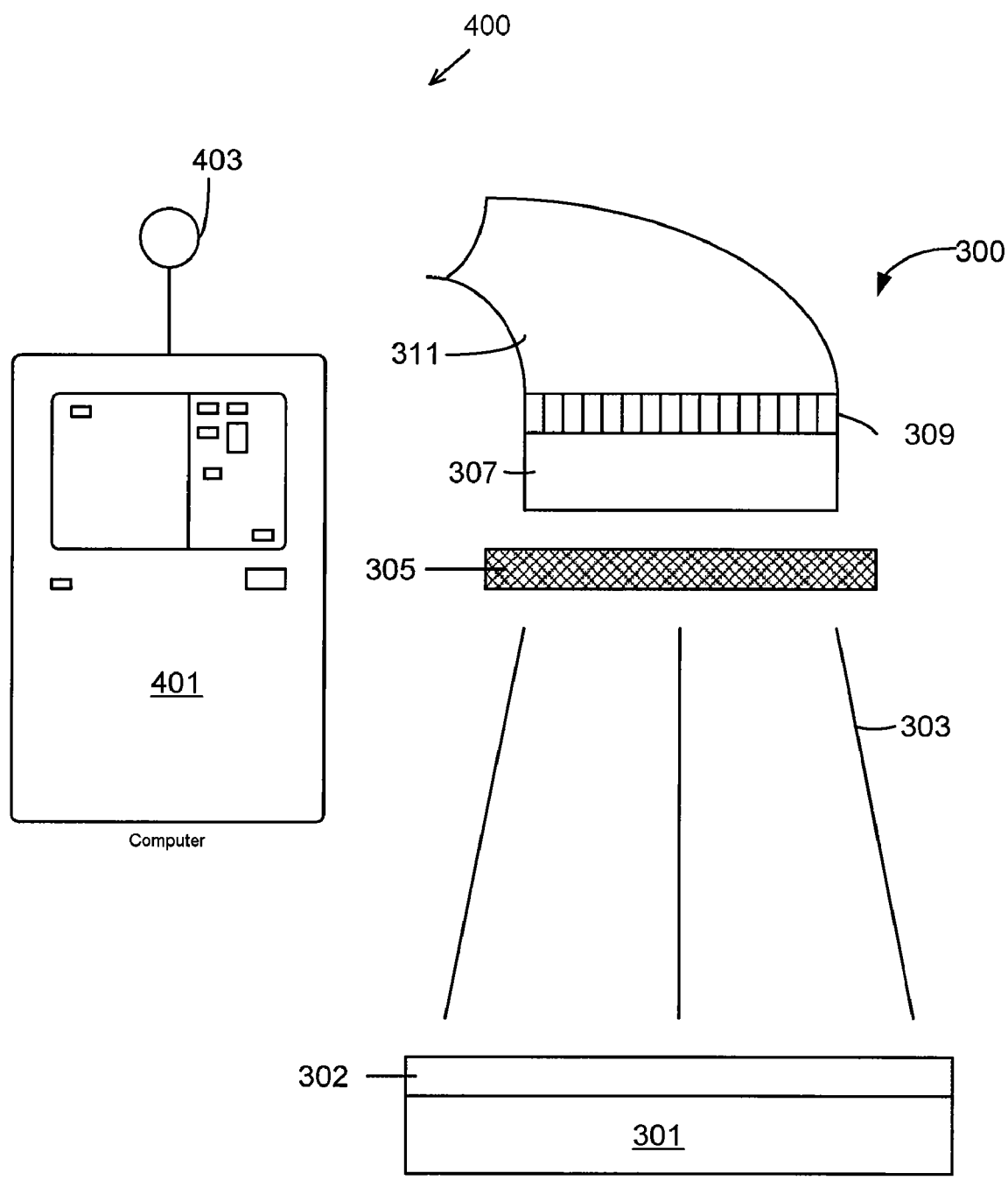
FIG. 4 is a simplified side-view diagram of an optical system including the apparatus according to an embodiment of the present system.

FIG. 4 is a simplified side-view diagram of an optical system 400 including the apparatus according to an embodiment of the present system. This diagram is merely an example, which should not unduly limit the scope of the claims herein. One of ordinary skill in the art would recognize many variations, alternatives, and modifications. Like reference numerals are used in this figure as in certain other figures herein. Such numbers are not intended to be limiting, however. As shown, the apparatus includes the optical source, which selectively provides light through the plurality of fiber cores in a fiber bundle 311. As noted, each of the fiber cores has input end and output end. Each of the input ends is coupled to the optical source. The plurality of fiber cores is numbered from 1 through N, where N is an integer greater than 1. Each of the output ends is numbered from 1 through N, which corresponds respectively to each of the plurality of fiber cores numbered from 1 through N. As merely an example, the fiber is a suitable material.

The array 309 is coupled to each of the plurality of fiber cores. The array is configured to allow each of the fiber ends to output toward a common plane 307. The array is arranged in a geometric configuration, which can form the raster image. The geometric configuration is composed of a plurality of pixel elements. Such pixel elements correspond to the outputs of each of the fiber cores. Depending upon the embodiment, the array can be made of any suitable material for holding each of the fiber ends in place relative to each other and also relative to the common plane. Of course, the array configuration depends upon the application.

The object 301 is operably coupled to the common plane. The object includes a photosensitive material 302, which has a surface that faces (directly or indirectly) the common plane. The photosensitive material can include photoresist such as positive or negative resist. The pattern is exposed 302 onto the photosensitive material. The pattern composed of a plurality of beams 303 numbered from 1 through N output from respective fiber ends numbered from 1 through N. The pattern is made from selectively allowing light to illuminate through one or more of the outputs numbered from 1 through N. Depending upon the embodiment, the object can include a blank mask, a semiconductor substrate, glass, a composite, etc. Depending upon the embodiment, there can be many other variations, modifications, and alternatives.

Preferably, the system also includes computing apparatus 401 coupled to interface 403. The computing apparatus includes display device, display screen, cabinet, keyboard, scanner and mouse. The mouse and keyboard are representative "user input devices." The mouse includes buttons for selection of buttons on a graphical user interface device. Other examples of user input devices are a touch screen, light pen, track ball, data glove, microphone, and so forth. In a preferred embodiment, the computer includes a Pentium™ class based computer, running Windows™ NT or XP operating system by Microsoft Corporation. However, the system is easily adapted to other operating systems and architectures by those of ordinary skill in the art without departing from the scope of the present invention. The apparatus includes computer components such as disk drives, a processor, storage device, etc. The storage devices include, but are not limited to, disk drives, magnetic tape, solid-state memory, bubble memory, etc. Additional hardware such as input/output (I/O) interface cards for connecting computer apparatus to external devices external storage, other computers or additional peripherals, is also included.

Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory. Although the above has been illustrated in terms of specific hardware features, it would be recognized that many variations, alternatives, and modifications exist. For example, any of the hardware features can be further combined, or even separated. The features can also be implemented, in part, through software or a combination of hardware and software. The hardware and software can be further integrated or less integrated depending upon the application.

Figure 5:
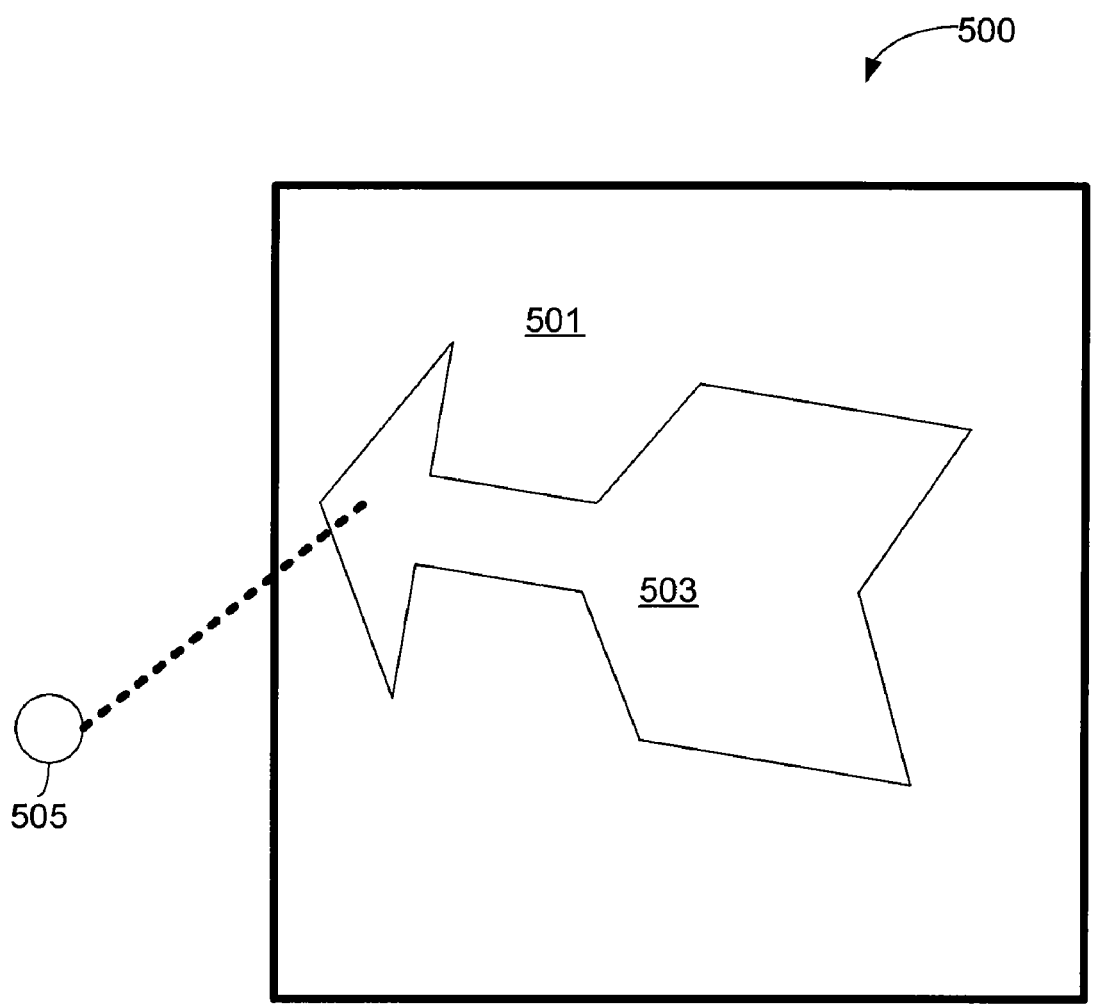
FIG. 5 is a simplified top-view diagram of a pattern printed using a method according to an embodiment of the present invention

FIG. 5 is a simplified top-view diagram 500 of a pattern 503 printed using a method according to an embodiment of the present invention. This diagram is merely an example, which should not unduly limit the scope of the claims herein. One of ordinary skill in the art would recognize many variations, alternatives, and modifications. As shown, the pattern 503 has been printed onto background 501, which was not exposed according to a specific embodiment. The pattern is composed of pixel element 505, which correspond to each of the fiber ends. Depending upon the embodiment, there can be other patterns, which are stored in memory in the computer apparatus. Such patterns can be retrieved, processed, where outputs for each of the pixel elements are determined.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for patterning objects, the method comprising:
   providing one of the objects, the object including an overlying layer of photosensitive material;
   selectively applying light through one or more fiber cores from a plurality of fiber cores, each of the fiber cores having an input end and an output end, each of the input ends being coupled to an optical source, the plurality of fiber cores being numbered from 1 through N, where N is an integer greater than 1, each of the output ends being numbered from 1 through N, which corresponds respectively to each of the plurality of fiber cores numbered from 1 through N, the output ends being terminated in a common plane; and
   exposing the photosensitive material to light emitted through the common plane;
   wherein each of the output ends numbered from 1 through N is associated with a separate one of a plurality of pixels numbered respectively from 1 through N.

2. The method of claim 1 wherein the pixels numbered from 1 through N form a pattern on the photosensitive material.

3. The method of claim 1 wherein the photosensitive material is photoresist.

4. The method of claim 1 wherein the object is a semiconductor wafer or a glass substrate.

5. The method of claim 1 wherein N is greater than 10.

6. The method of claim 1 wherein the plurality of fiber cores are provided in a fiber bundle.

7. The method of claim 1 further comprising an array coupled to each of the output ends.

8. The method of claim 7 wherein the array is an M by L array, where M is an integer and L is an integer.

9. The method of claim 1 further comprising illuminating the light through a lens coupled between the object and the common plane.

10. The method of claim 1 wherein the selectively applying turns on or turns off light to each of the fiber cores.

11. A method for manufacturing objects, the method comprising:
    providing one of the objects, the object including an overlying layer of photosensitive material;
    selectively applying light through one or more fiber cores from a plurality of fiber cores, each of the fiber cores having an input end and an output end, each of the input ends being coupled to an optical source, the plurality of fiber cores being numbered from 1 through N, where N is an integer greater than 1, each of the output ends being numbered from 1 through N, which corresponds respectively to each of the plurality of fiber cores numbered from 1 through N, the output ends being terminated in a common plane; and
    exposing the photosensitive material to light emitted selectively through the one or more fiber cores via the common plane;
    wherein each of the output ends numbered from 1 through N is associated with one of a plurality of pixels numbered respectively from 1 through N; and
    wherein each of the pixels is at either a first state or a second state based upon the selectively applying.

12. The method of claim 11 wherein the first state corresponds to an on state of light.

13. The method of claim 11 wherein the second state corresponds to an off state of light.

14. The method of claim 11 wherein each of the pixels is either at the first state or a second state or a third state or an nth state.

* * * * *